United States Patent
Hirase

(10) Patent No.: US 8,994,012 B2
(45) Date of Patent: Mar. 31, 2015

(54) ORGANIC EL PANEL AND PROCESS FOR PRODUCTION THEREOF

(75) Inventor: Takeshi Hirase, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 13/880,035

(22) PCT Filed: Oct. 14, 2011

(86) PCT No.: PCT/JP2011/073711
§ 371 (c)(1),
(2), (4) Date: Apr. 17, 2013

(87) PCT Pub. No.: WO2012/053451
PCT Pub. Date: Apr. 26, 2012

(65) Prior Publication Data
US 2013/0214266 A1    Aug. 22, 2013

(30) Foreign Application Priority Data
Oct. 21, 2010  (JP) ................ 2010-236401

(51) Int. Cl.
*H01L 51/52* (2006.01)
*H05B 33/04* (2006.01)
*H01L 27/32* (2006.01)

(52) U.S. Cl.
CPC ......... *H01L 51/5253* (2013.01); *H01L 27/3281* (2013.01); *H05B 33/04* (2013.01)
USPC .......................................................... 257/40

(58) Field of Classification Search
CPC ............................. H05B 33/04; H01L 51/5253
USPC ..................................... 257/40, 99
See application file for complete search history.

(56) References Cited

U.S. PATENT DOCUMENTS

| 5,346,752 A | 9/1994 | Ohashi et al. |
| 6,432,516 B1 | 8/2002 | Terasaki et al. |
| 2003/0071570 A1 | 4/2003 | Iwase et al. |
| 2003/0164677 A1 | 9/2003 | Kubota et al. |
| 2013/0214266 A1* | 8/2013 | Hirase ............................. 257/40 |

FOREIGN PATENT DOCUMENTS

| JP | 5-008346 A | 1/1993 |
| JP | 8-187825 A | 7/1996 |
| JP | 2000-223264 A | 8/2000 |
| JP | 2003-178866 A | 6/2003 |
| JP | 2003-249349 A | 9/2003 |
| JP | 2006-004650 A | 1/2006 |

OTHER PUBLICATIONS

English translation of Japanese Kokai 2006-004650, Dec. 2014.*
International Search Report for PCT Application No. PCT/JP2011/073711 mailed Dec. 6, 2011; Total 4 pages (2 pages English translation and 2 pages of PCT search report).

* cited by examiner

*Primary Examiner* — Mark Prenty
(74) *Attorney, Agent, or Firm* — Morrison & Foerster LLP

(57) ABSTRACT

An organic EL panel (1) in accordance with one embodiment of the present invention includes: an element substrate (10); a sealing substrate (14); and an organic EL element (15) which is (i) sandwiched between the element substrate (10) and the sealing substrate (14) and (ii) constituted by at least an anode, an organic light emitting layer and a cathode which are stacked together. The sealing substrate (14) has, on its surface facing the element substrate (10), a PVA sealing film (13) and an $SiO_2$ sealing film (12) stacked together.

19 Claims, 3 Drawing Sheets

ORGANIC EL PANEL AND PROCESS FOR PRODUCTION THEREOF

CROSS REFERENCE TO RELATED APPLICATIONS

This is a U.S. National Phase patent application of PCT/JP2011/073711, filed Oct. 14, 2011, which claims priority to Japanese Patent Application No. 2010-236401, filed Oct. 21, 2010, each of which is hereby incorporated by reference in the present disclosure in its entirety.

TECHNICAL FIELD

The present invention relates to an organic EL panel and a method for producing the organic El panel.

BACKGROUND ART

An organic EL (Electroluminescence) display device is characterized by its (i) low power consumption which is lower than that of a cathode ray tube (CRT) and is equivalent to that of a liquid crystal display (LCD), (ii) high image quality, and (iii) wide viewing angle. Because of these characteristics, the organic EL display device has been the focus of attention.

In general, an organic EL element used in an organic EL display device is configured such that organic material is vertically sandwiched between electrodes (anode and cathode). In such an organic EL element, holes and electrons are injected from the anode and the cathode, respectively, into an organic layer made up of the organic material. In the organic layer, the holes and the electrons are recombined. This causes light emission.

With such an organic EL element, non-radiative points called dark spots may be generated if the organic layer becomes crystallized due to entrance of moisture or oxygen etc. into to the organic EL element. The dark spots are known to grow over time and the growth of the dark spots is known to reduce the life span of the organic EL element. Hence, when producing an organic EL display, it is necessary to suppress entrance of moisture and oxygen etc. into an organic EL element as much as possible.

Under such circumstances, some organic EL display devices are each configured to seal an organic EL element by (i) covering, with a sealing resin, a display region on an element substrate such as a glass substrate which is provided with the organic EL element and (ii) combining a sealing substrate (such as glass substrate) to the element substrate so that the sealing substrate faces the element substrate and the sealing resin is sandwiched between the element substrate and the sealing substrate. In an organic EL display device having such a configuration, generally, an ultraviolet curable resin or a thermosetting resin is used as a sealing resin and such a sealing resin is cured after the sealing substrate is attached. The organic EL element is driven in response to a drive voltage applied thereto via external electrodes and external terminals which are provided around the display region.

For example, Patent Literature 1 discloses a configuration like above.

FIGS. 6A-C depict explanatory views schematically illustrating an organic EL display device and a method for producing the organic EL display device which are disclosed in Patent Literature 1.

As illustrated in FIGS. 6A-C, the organic EL display device is configured such that an element substrate 101 and a sealing substrate 103 are bonded together so as to face each other via a sealing resin 102 for sealing a display region. In such an organic EL display device, a protection wall (sealing part) 107 for separating the display region from an electrode region is provided between the element substrate 101 and the sealing substrate 103.

CITATION LIST

Patent Literatures

Patent Literature 1
Japanese Patent Application Publication, Tokukai, No. 2003-178866 A (Publication Date: Jun. 27, 2003)
Patent Literature 2
Japanese Patent Application Publication, Tokukai, No. 2000-223264 A (Publication Date: Aug. 11, 2000)

SUMMARY OF INVENTION

Technical Problem

However, the configuration disclosed in Patent Literature 1 has the following problems:

1) It is necessary to separately form the protection wall (sealing part) 107 around an organic EL element, and therefore is not possible to achieve a display device having a narrow frame.
2) In a case where the sealing substrate 103 is made of a thin film, the following occurs. That is, such a sealing substrate 103 is vulnerable to moisture and oxygen penetration because it has pinholes thereon. Such penetration cannot be completely prevented even by the formation of the sealing resin 102, and may therefore adversely affect the organic EL element.
3) It is difficult to ensure flatness, and this may therefore influence optical characteristics.

The present invention has been made in view of the problems, and it is an object of the present invention to provide (i) a dependable, high quality organic EL panel having a narrow frame and (ii) a method for producing the organic EL panel.

It is also an object of the present invention to provide (i) an organic EL panel having excellent flexibility and (ii) a method for producing the organic EL panel.

Solution to Problem

In order to attain the object, an organic EL panel of the present invention includes: an element substrate; a sealing substrate; and an organic EL element which is (i) sandwiched between the element substrate and the sealing substrate and (ii) constituted by at least an anode, an organic light emitting layer and a cathode which are stacked together, the sealing substrate having, on its surface facing the element substrate, a resin sealing film and an inorganic sealing film stacked together.

According to the configuration, the resin sealing film and the inorganic sealing film constitute a double-layer structure. This certainly prevents, even in a case where the sealing substrate is made of a thin film material, the organic EL element from being adversely affected by moisture, oxygen, or the like coming through the sealing substrate.

Therefore, it is possible to provide a highly flexible organic EL panel.

Furthermore, since the resin sealing film and the inorganic sealing film are stacked on the surface of the sealing substrate which surface faces the element substrate, it is easy to obtain a flat organic EL panel. This reduces the probability of adverse effects on optical characteristics of the organic EL panel.

Furthermore, it is possible to achieve an organic EL panel having a narrow frame.

In order to attain the object, the organic EL panel of the present invention can be configured such that the resin sealing film, the inorganic sealing film, and an adhesive are stacked in this order on the surface of the sealing substrate which surface faces the element substrate.

With the configuration, even in a case where the sealing substrate is made of a thin film material, the resin sealing film can offset unevenness or pinholes of the thin film material.

In order to attain the object, the organic EL panel of the present invention can be configured such that the inorganic sealing film and the resin sealing film are stacked in this order on the surface of the sealing substrate which surface faces the element substrate.

According to the configuration, the resin sealing film serves also as an adhesive. This makes it unnecessary to separately provide an adhesive.

In order to attain the object, a method for producing an organic EL panel in accordance with the present invention is for producing an organic EL panel including: an element substrate; a sealing substrate; and an organic EL element which is (i) sandwiched between the element substrate and the sealing substrate and (ii) constituted by at least an anode, an organic light emitting layer and a cathode which are stacked together, said method, including the step of: forming, on a surface of the sealing substrate which surface faces the element substrate, a resin sealing film made of polyvinyl alcohol and an inorganic sealing film made of silicon oxide so that the resin sealing film and the inorganic sealing film are stacked together.

According to the method, the sealing film made of polyvinyl alcohol is highly hydrophilic and thus absorbs moisture coming from the sealing substrate side. This makes it possible to prevent adverse effects on the organic EL element.

Furthermore, the sealing film made of silicon oxide formed by vapor deposition such as plasma CVD is highly hydrophilic and thus absorbs moisture coming from the sealing substrate side. This makes it possible to even more certainly prevent adverse effects on the organic EL element.

Hence, even in a case where the sealing substrate is made of a thin film material, a double-layer structure constituted by the sealing film made of polyvinyl alcohol and the sealing film made of oxide silicon makes it possible to certainly prevent the organic EL element from being adversely affected by moisture or oxygen coming through the sealing substrate.

Moreover, since the organic EL panel is configured such that the sealing film made of polyvinyl alcohol and the sealing film made of silicon oxide are stacked on the surface of the sealing substrate which surface faces the element substrate, it is easy to obtain a flat organic EL panel and the probability of adverse effects on optical characteristics of the organic EL panel is reduced.

Furthermore, it is possible to obtain an organic EL panel having a narrow frame.

Additional objects, features, and strengths of the present invention will be made clear by the description below. Further, the advantages of the present invention will be evident from the following explanation in reference to the drawings.

Advantageous Effects of Invention

An organic EL panel of the present invention includes: an element substrate; a sealing substrate; and an organic EL element which is (i) sandwiched between the element substrate and the sealing substrate and (ii) constituted by at least an anode, an organic light emitting layer and a cathode which are stacked together, the sealing substrate having, on its surface facing the element substrate, a resin sealing film and an inorganic sealing film stacked together.

A method for producing an organic EL panel in accordance with the present invention is a method for producing an organic EL panel including: an element substrate; a sealing substrate; and an organic EL element which is (i) sandwiched between the element substrate and the sealing substrate and (ii) constituted by at least an anode, an organic light emitting layer and a cathode which are stacked together, said method including the step of: forming, on a surface of the sealing substrate which surface faces the element substrate, a resin sealing film made of polyvinyl alcohol and an inorganic sealing film made of silicon oxide so that the resin sealing film and the inorganic sealing film are stacked together.

Hence, it is possible to provide (i) a dependable, high quality organic EL panel having a narrow frame and (ii) a method for producing the organic EL panel.

DESCRIPTION OF EMBODIMENTS

The following description will discuss embodiments of the present invention in detail.

Embodiment 1

The present embodiment will be described below with reference to FIGS. 1 and 2A-E.

(Overall Configuration)

An overall configuration of an organic EL panel will be first described below with reference to FIG. 1.

Figure 1:
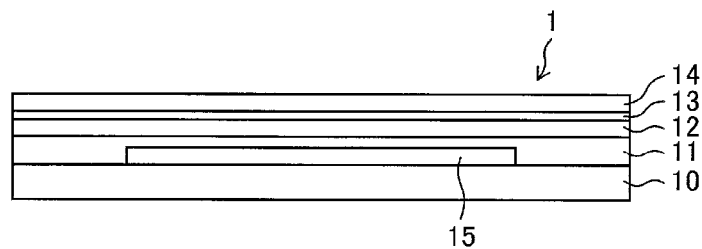
FIG. 1 is a cross-sectional view illustrating a configuration of an organic EL panel in accordance with Embodiment 1 of the present invention.

FIG. 1 is a cross-sectional view illustrating the configuration of the organic EL panel in accordance with the present embodiment.

As illustrated in FIG. 1, an organic EL panel 1 is configured such that (i) an organic EL element 15 is provided on an element substrate 10 and (ii) an adhesive 11 is provided so as to cover the organic EL element 15.

On the adhesive 11, there are provided, in the order named, (i) an $SiO_2$ sealing film 12, which has a thickness of 5 μm to 50 μm and is made of $SiO_2$ (silicon oxide) and (ii) a PVA sealing film 13, which has a thickness of 5 μm to 50 μm and is made of PVA (polyvinyl alcohol).

On the PVA sealing film 13, there is provided a sealing substrate 14, which has a thickness of 30 µm to 100 µm and is made of a thin film base material.

The element substrate 10 used here is, for example, a substrate made of an inorganic material such as glass or quartz. Alternatively, the element substrate 10 can be a plastic substrate made of polyethylene terephthalate (PET), polycarbazole or polyimide etc. In light of flexibility of the organic EL panel 1, however, it is preferable to use a flexible plastic substrate.

The organic EL element 15 used here is for example, in a case where a bottom-edge (BE) structure is employed, an element constituted by (i) a bottom electrode (anode) provided on the element substrate 10, (ii) a light emitting layer provided on the bottom electrode, and (iii) a top electrode (cathode) provided on the light emitting layer.

The light emitting layer can be constituted by (i) a hole transporting layer, (ii) an organic light emitting layer provided on the hole transporting layer, and (iii) an electron transporting layer provided on the organic light emitting layer. However, the light emitting layer is not limited to such a configuration. Each of the layers above can be made of a known material.

For example, the hole transporting layer can be made from (i) a tertiary amine derivative such as a triphenyl diamine derivative, (ii) hydrazine, or the like. The organic light emitting layer can be made from (a) a trisquinolinolate aluminum complex, (b) a substance containing a dopant such as rubrene, or the like. The electron transporting layer can be made from polysilane, an oxadiazole derivative, or the like.

The anode can be made from a known electrode material. Specific examples of a transparent electrode material include: metals such as gold (Au), platinum (Pt) and nickel (Ni), each of which has a work function of 4.5 eV or more; and oxides such as an indium (In)-tin (Sn) oxide (ITO), a tin (Sn) oxide ($SNO_2$), and an indium (In)-zinc (Zn) oxide (IZO).

The cathode can be made from a known electrode material. Specific examples of the known electrode material include: metals such as lithium (Li), calcium (Ca), cerium (Ce), barium (Ba) and aluminum (Al), each of which has a work function 4.5 eV or more; and alloys containing these metals such as Mg:Ag alloy and Li:Al alloy.

The adhesive 11 used here is for example, but not limited to, (i) an acrylic resin adhesive containing, as a main component, acrylic acid and its derivative and (ii) an epoxy resin adhesive containing an epoxy resin as a main component.

The sealing substrate 14 used here is a substrate made of a thin film material (film). Examples of the thin film material include thin film materials each of which is made of organic resin such as polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyarylate (PAR), polybutylene terephthalate (PBT), polypropylene, polypropylene sulfide, polyphenylene sulfide, polyphenylene oxide, polyphthalamide, or polyimide.

Since a thin film material is used as the sealing substrate 14, it is possible to provide a highly flexible organic EL panel 1.

Note here that it is possible to employ a configuration in which (i) a thin film material serving as the sealing substrate 14, (ii) the PVA sealing film 13, and (iii) the $SiO_2$ sealing film 12 are integral with each other.

As described earlier, the organic EL panel 1 is configured such that the PVA sealing film 13 and the $SiO_2$ sealing film 12 are provided, in this order, on a surface of the sealing substrate 14 which surface faces the organic EL element 15.

Even in a case where a thin film material is used as the sealing substrate 14, unevenness and pinholes of the thin film material can be offset because the PVA sealing film 13 is provided on the sealing substrate 14.

Furthermore, since the PVA sealing film 13 is highly hydrophilic and thus absorbs moisture coming through the sealing substrate 14, it is possible to prevent adverse effects of the moisture on the organic EL element 15.

Moreover, since the $SiO_2$ sealing film 12, which is formed by vapor deposition, is also highly hydrophilic and thus absorbs moisture coming through the PVA sealing film 13, it is possible to certainly prevent adverse effects of the moisture on the organic EL element 15.

In addition, the $SiO_2$ sealing film 12 has very high mechanical strength and excellent heat resistance.

According to the organic EL panel 1 of the present embodiment, the PVA sealing film 13 and the $SiO_2$ sealing film 12 are provided on the sealing substrate 14. This increases shielding characteristics and increases dependability of the organic EL panel 1. Besides, unlike the technique of Patent Literature 1, there is no more necessity for a protection wall, and therefore it is possible to achieve an organic EL panel 1 having a narrow frame. Furthermore, it is easy to obtain a flat organic EL panel 1, and therefore optical characteristics of the organic EL panel 1 are less adversely affected.

(Production Method)

A method for producing the organic EL panel in accordance with the present embodiment will be described next with reference to FIGS. 2A-E.

FIG. 2 is a cross-sectional view illustrating the method for producing the organic EL panel in accordance with the present embodiment.

Figure 2A:
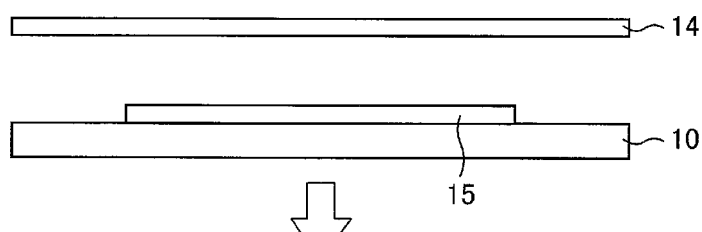
FIGS. 2A-E depict cross-sectional views illustrating a method for producing the organic EL panel in accordance with Embodiment 1 of the present invention.

First, as illustrated in FIG. 2A, an organic EL element 15 is formed on an element substrate 10.

In a case where a bottom-edge (BE) structure is employed, the organic EL element 15 is constituted by (i) a bottom electrode (anode) provided on the element substrate 10, (ii) a light emitting layer provided on the bottom electrode, and (iii) a top electrode (cathode) provided on the light emitting layer.

In a case where a top-edge (TE) structure is employed, the organic EL element 15 is constituted by (i) a bottom electrode (cathode) provided on the element substrate 10, (ii) a light emitting layer provided on the bottom electrode, and (iii) a top electrode (anode) provided on the light emitting layer.

The anode and the cathode can be each made from a known electrode material by a method selected as appropriate from EB vapor deposition, sputtering, ion plating and resistive heating deposition, and the like. Note, however, that the method is not limited to those listed above.

The light emitting layer can be constituted by (i) a hole transporting layer, (ii) an organic light emitting layer provided on the hole transporting layer, and (iii) an electron transporting layer provided on the organic light emitting layer. Each of the layers can be formed by, for example, vacuum deposition, Langmuir-Blodgett deposition, dip coating, spin coating, organic molecular beam epitaxy, or the like.

Figure 2B:
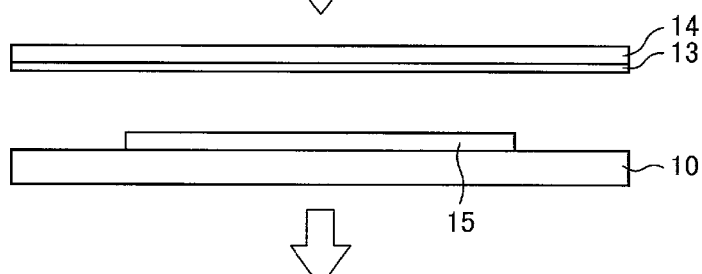

Next, as illustrated in FIG. 2B, a PVA sealing film 13 is formed on a sealing substrate 14.

Specifically, a thin film material which has a thickness of 30 µm to 100 µm and is to be used as the sealing substrate 14 is subjected to, for example, UV-ozone cleaning to have increased wettability. Then, PVA is applied to the thin film material by, for example, a spinner method, printing, or a slit method, and is then baked. In this way, a PVA sealing film 13 having a thickness of 5 µm to 50 µm is formed.

Figure 2C:
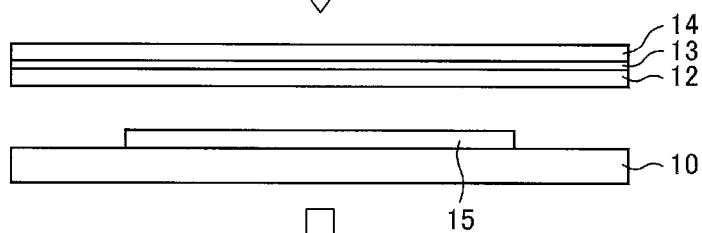

Next, as illustrated in FIG. 2C, an SiO2 sealing film 12 is formed on the PVA sealing film 13.

Specifically, $SiO_2$ is applied to the PVA sealing film 13 at a temperature in a range of 80° C. to 140° C. by, for example, plasma CVD (Chemical Vapor Deposition), and baked and cured at a temperature in a range of 80° C. to 140° C. In this way, an $SiO_2$ sealing film 12 having a thickness of 5 μm to 50 μm is formed.

Figure 2D:
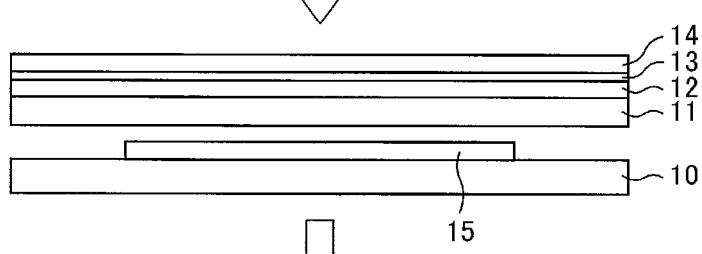

Next, as illustrated in FIG. 2D, an adhesive 11 is formed on the SiO2 sealing film 12.

Specifically, for example an acid-free epoxy resin adhesive is applied to the $SiO_2$ sealing film 12 by transferring the epoxy resin adhesive onto the $SiO_2$ sealing film 12.

Figure 2E:
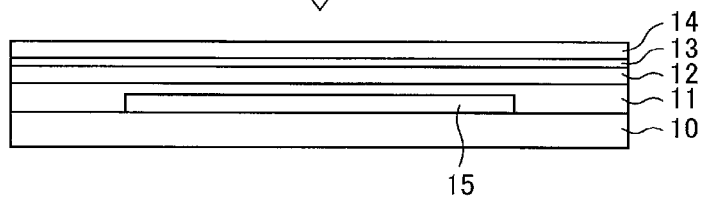

Next, as illustrated in FIG. 2E, the element substrate 10 and the sealing substrate 14 are combined together.

The sealing substrate 14 and the element substrate 10 are combined in a dry atmosphere (dew-point temperature: −30° C. or less, preferably −70° C. or less) or in a vacuum atmosphere (100 Pa or less). If a pressure is applied to the sealing substrate 14 when the sealing substrate 14 and the element substrate 10 are combined, the adhesive 11 (filling resin) evenly spreads out.

Next, a region where the adhesive 11 is formed is irradiated with UV light (0.5 J to 10 J (preferably 1 J to 6 J)), and then subjected to heat (at a temperature of not lower than 70° C. but not higher than 120° C. for not less than 10 minutes but not more than 2 hours) in the atmosphere, whereby the adhesive 11 is cured.

Embodiment 2

Figure 3:
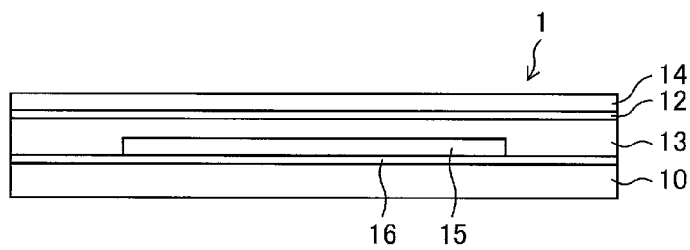
FIG. 3 is a cross-sectional view illustrating a configuration of an organic EL panel in accordance with Embodiment 2 of the present invention.

The following description will discuss, with reference to FIG. 3, one embodiment of the organic EL panel in accordance with the present invention. In the present embodiment, for convenience of description, members whose functions are identical to those of the members illustrated in the drawings described in Embodiment 1 are given the same reference numerals, and their descriptions are omitted here.

(Overall Configuration)

FIG. 3 is a cross-sectional view illustrating a configuration of an organic EL panel in accordance with the present embodiment.

As illustrated in FIG. 3, an organic EL panel 1 is configured such that (i) a protection film 16 serving as an inorganic sealing film is provided on an element substrate 10 and (ii) an organic EL element 15 is provided on the protection film 16.

On the organic EL element 15, there are provided, in the order named, (i) a PVA sealing film 13 made of PVA and having a thickness of 5 μm to 50 μm and (ii) an $SiO_2$ sealing film 12 made of $SiO_2$ and having a thickness of 5 μm to 50 μm.

On the $SiO_2$ sealing film 12, there is provided a sealing substrate 14 having a thickness of 30 μm to 100 μm and made of a thin film material.

The protection film 16 used here is, for example, a highly hydrophilic inorganic film such as a film formed from $SiO_2$, $Al_2O_3$ or DLC (diamond-like carbon) by vapor deposition. Because of this, even in a case where a plastic substrate etc. is used as the element substrate 10, the protection film 16 absorbs moisture coming through the element substrate 10 and thus prevents adverse effects on the organic EL element 15.

As described earlier, the $SiO_2$ sealing film 12 and the PVA sealing film 13 are provided in this order on a surface of the sealing substrate 14 which surface faces the organic EL element 15.

The PVA sealing film 13 serves also as an adhesive, and there is therefore no more necessity of separately providing an adhesive.

The $SiO_2$ sealing film 12, which is formed by vapor deposition, is highly hydrophilic and thus absorbs moisture coming through the sealing substrate 14. This makes it possible to prevent adverse effects of the moisture on the organic EL element 15.

Furthermore, the PVA sealing film 13 is also highly hydrophilic and thus absorbs moisture coming through the $SiO_2$ sealing film 12. This makes it possible to certainly prevent adverse effects of moisture on the organic EL element 15.

The organic EL panel 1 of the present embodiment is configured such that (i) the $SiO_2$ sealing film 12 and the PVA sealing film 13 are provided on the sealing substrate 14 and (ii) the protection film 16 is provided on the element substrate 10. This increases shielding characteristics and increases dependability of the organic EL panel 1. Besides, unlike the technique of Patent Literature 1, there is no more necessity for a protection wall, and therefore it is possible to achieve an organic EL panel 1 having a narrow frame. Furthermore, it is easy to obtain a flat organic EL panel 1, and therefore optical characteristics of the organic EL panel 1 are less adversely affected.

(Production Method)

A method for producing the organic EL panel in accordance with the present embodiment will be described next with reference to FIGS. 4A-E.

Figure 4A:
FIGS. 4A-E depict cross-sectional views illustrating a method for producing the organic EL panel in accordance with Embodiment 2 of the present invention

First, as illustrated in FIG. 4A, a protection film 16 is formed on an element substrate 10.

Specifically, the protection film 16 (e.g., a highly hydrophilic inorganic film) is formed on the element substrate 10 by plasma CVD, sputtering, vacuum deposition or the like.

Figure 4B:
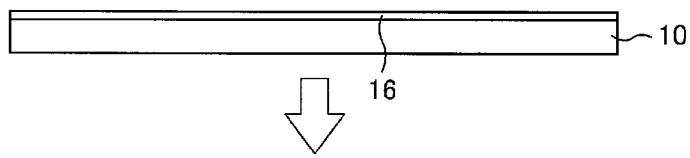

Next, as illustrated in FIG. 4B, an organic EL element 15 is formed on the protection film 16.

The organic EL element 15 is constituted by (i) a bottom electrode provided on the protection film 16, (ii) a light emitting layer provided on the bottom electrode, and (iii) a top electrode provided on the light emitting layer.

The bottom electrode and the top electrode can each be formed by a known method selected as appropriate from EB vapor deposition, sputtering, ion plating, and resistive heating deposition etc. Note, however, that the method is not limited to those listed above.

The light emitting layer can be constituted by (i) a hole transporting layer, (ii) an organic light emitting layer provided on the hole transporting layer, and (iii) an electron transporting layer provided on the organic light emitting layer. Each of the layers can be formed by a known method. Examples of the known method include vacuum deposition, Langmuir-Blodgett deposition, dip coating, spin coating, and organic molecular beam epitaxy.

Figure 4C:
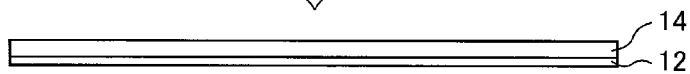

Next, as illustrated in FIG. 4C, an $SiO_2$ sealing film 12 is formed on a sealing substrate 14.

Specifically, a thin film material which has a thickness of 30 μm to 100 μm and is to be used as the sealing substrate 14 is subjected to, for example, UV-ozone cleaning to have increased wettability. After that, $SiO_2$ is applied to the thin film at a temperature in a range of 80° C. to 140° C. by, for example, plasma CVD (Chemical Vapor Deposition), and baked and cured at a temperature in a range of 80° C. to 140° C. In this way, an $SiO_2$ sealing film 12 having a thickness of 5 μm to 50 μm is formed.

Figure 4D:
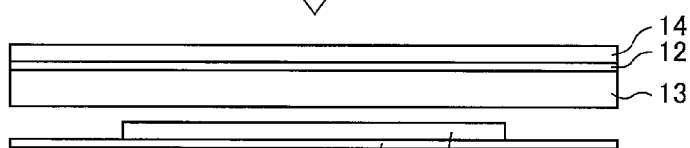

Next, as illustrated in FIG. 4D, a PVA sealing film 13 is formed on the $SiO_2$ sealing film 12.

Specifically, PVA is applied to the $SiO_2$ sealing film 12 by, for example, a spinner method, printing, or a slit method. In this way, a PVA sealing film 13 having a thickness of 5 μm to 50 μm is formed.

Figure 4E:
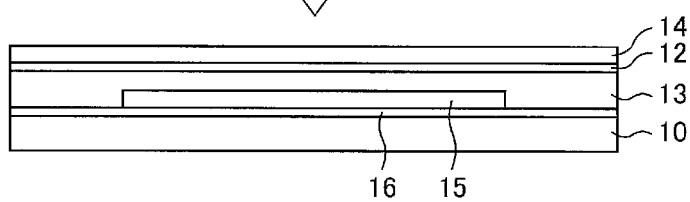

Next, as illustrated in FIG. 4E, the element substrate 10 and the sealing substrate 14 are combined together.

The element substrate 10 and the sealing substrate 14 are combined together in a dry atmosphere (dew-point temperature: −30° C. or less, preferably −70° C. or less) or in a vacuum atmosphere (100 Pa or less). If a pressure is applied to the sealing substrate 14 when the element substrate 10 and the sealing substrate 14 are combined, the PVA sealing film 13 (filling resin) evenly spreads out.

Next, a region where the PVA sealing film 13 is formed is irradiated with UV light (0.5 J to 10 J (preferably 1 J to 6 J)) and then subjected to heat (at a temperature of not lower than 70° C. but not higher than 120° C. for not less than 10 minutes but not more than 2 hours) in the atmosphere, whereby the PVA sealing film 13 is cured.

Embodiment 3

Figure 5:
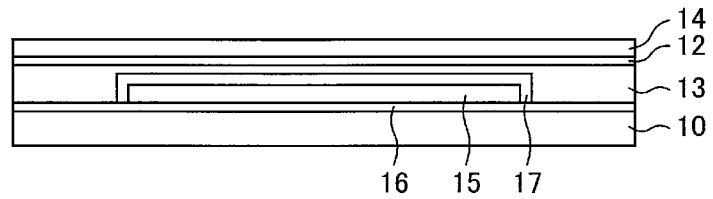
FIG. 5 is a cross-sectional view illustrating a configuration of an organic EL panel in accordance with Embodiment 3 of the present invention
Figure 6A:
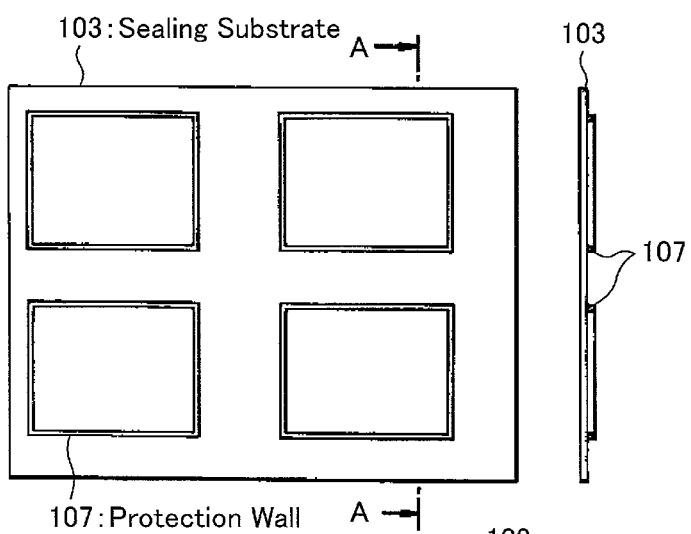
FIGS. 6A-C depict cross-sectional views illustrating a configuration of a conventional organic EL display device.
Figure 6B:
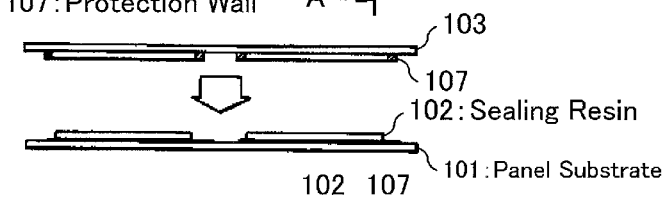
Figure 6C:
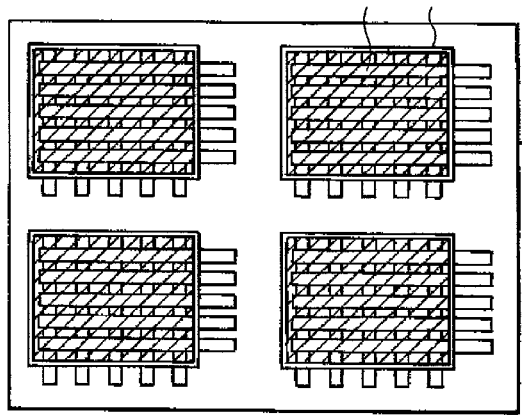

The following description will discuss, with reference to FIG. 5, one embodiment of the organic EL panel in accordance with the present invention. In the present embodiment, for convenience of description, members whose functions are identical to those of the members illustrated in the drawings described in Embodiments 1 and 2 are given the same reference numerals, and their descriptions are omitted here.

(Overall Configuration)

FIG. 5 is a cross-sectional view illustrating a configuration of an organic EL panel in accordance with the present embodiment.

As illustrated in FIG. 5, an organic EL panel 1 is configured such that (i) a protection film 16 is provided on an element substrate 10 and (ii) an organic EL element 15 is provided on the protection film 16.

A protection film 17 is provided so as to cover the organic EL element 15.

On the protection film 17, there are provided, in the order named, (i) a PVA sealing film 13 made of PVA and having a thickness of 5 μm to 50 μm and (ii) an $SiO_2$ sealing film 12 made of $SiO_2$ and having a thickness of 5 μm to 50 μm.

On the $SiO_2$ sealing film 12, there is provided a sealing substrate 14 which has a thickness of 30 μm to 100 μm and is made of a thin film material.

The protection film 16 used here is, for example, a highly hydrophilic inorganic film such as a film formed from $SiO_2$, $Al_2O_3$ or DLC (diamond-like carbon) by vapor deposition. Because of this, even in a case where a plastic substrate etc. is used as the element substrate 10, (i) the protection film 16 absorbs moisture coming through the element substrate 10 and (ii) the protection film 17 absorbs moisture coming through the PVA sealing film 13, and thus prevents adverse effects on the organic EL element 15.

The organic EL panel 1 of the present embodiment is configured such that (i) the $SiO_2$ sealing film 12 and the PVA sealing film 13 are provided on the sealing substrate 14 and (ii) the protection films 16 and 17 are provided so as to surround the organic EL element 15. This increases shielding characteristics and increases dependability of the organic EL panel 1. Besides, unlike the technique of Patent Literature 1, there is no more necessity for a protection wall, and therefore it is possible to achieve an organic EL panel 1 having a narrow frame. Furthermore, it is easy to obtain a flat organic EL panel 1, and therefore optical characteristics of the organic EL panel 1 are less adversely affected.

(Production Method)

A method for producing the organic EL panel in accordance with the present embodiment will be described next.

First, a protection film 16 is formed on an element substrate 10.

Specifically, the protection film 16 (i.e., a highly hydrophilic inorganic film) is formed on the element substrate 10 by plasma CVD, sputtering, vacuum deposition or the like.

Next, an organic EL element 15 is formed on the protection film 16.

The organic EL element 15 is constituted by (i) a bottom electrode provided on the protection film 16, (ii) a light emitting layer provided on the bottom electrode, and (iii) a top electrode provided on the light emitting layer.

The bottom electrode and the top electrode can each be formed by a known method selected as appropriate from EB vapor deposition, sputtering, ion plating, and resistive heating deposition etc. Note, however, that the method is not limited to those listed above.

The light emitting layer can be constituted by (i) a hole transporting layer, (ii) an organic light emitting layer provided on the hole transporting layer, and (iii) an electron transporting layer provided on the organic light emitting layer. Each of the layers can be formed by a known method. Examples of the known method include vacuum deposition, Langmuir-Blodgett deposition, dip coating, spin coating, and organic molecular beam epitaxy.

Next, a protection film 17 is formed on the organic EL element 15 so as to cover the organic EL element 15.

Specifically, the protection film 17 (e.g., a highly hydrophilic inorganic film) is formed on the element substrate 10 by plasma CVD, sputtering, vacuum deposition, or the like.

Next, an $SiO_2$ sealing film 12 is formed on a sealing substrate 14.

Specifically, a thin film material to be used as the sealing substrate 14 is subjected to, for example, UV-ozone cleaning to have increased wettability. After that, $SiO_2$ is applied to the thin film material at a temperature in a range of 80° C. to 140° C. by, for example, plasma CVD (Chemical Vapor Deposition), and baked and cured at a temperature in a range of 80° C. to 140° C. In this way, an $SiO_2$ sealing film 12 having a thickness of 5 μm to 50 μm is formed.

Next, a PVA sealing film 13 is formed on the $SiO_2$ sealing film 12.

Specifically, PVA is applied to the $SiO_2$ sealing film 12 by, for example, a spinner method, printing or a slit method. In this way, a PVA sealing film 13 having a thickness of 5 μm to 50 μm is formed.

Next, the element substrate 10 and the sealing substrate 14 are combined together.

The element substrate 10 and the sealing substrate 14 are combined together in a dry atmosphere (dew-point temperature: −30° C. or less, preferably −70° C. or less) or in a vacuum atmosphere (100 Pa or less). If a pressure is applied to the sealing substrate 14 when the element substrate 10 and the sealing substrate 14 are combined, the PVA sealing film 13 (filling resin) evenly spreads out.

Next, a region where the PVA sealing film 13 is formed is irradiated with UV light (0.5 J to 10 J (preferably 1 J to 6 J)), and then subjected to heat (at a temperature of not lower than 70° C. but not higher than 120° C. for not less than 10 minutes but not more than 2 hours) in the atmosphere, whereby the PVA sealing film 13 is cured.

The present invention is not limited to the descriptions of the embodiments, but can be altered in many ways by a person skilled in the art within the scope of the claims. In other words, a new embodiment can be obtained from a proper combination of technical means which are altered as appropriate within the scope of the claims. That is, the embodiments discussed in the foregoing description of embodiments and concrete examples serve solely to illustrate the technical details of the present invention, which should not be narrowly interpreted within the limits of such embodiments and concrete examples, but rather may be applied in many variations within the spirit of the present invention, provided that such variations do not exceed the scope of the patent claims set forth below.

Summary of Present Invention

As has been described, an organic EL panel of the present invention includes: an element substrate; a sealing substrate; and an organic EL element which is (i) sandwiched between the element substrate and the sealing substrate and (ii) constituted by at least an anode, an organic light emitting layer and a cathode which are stacked together, the sealing substrate having, on its surface facing the element substrate, a resin sealing film and an inorganic sealing film stacked together.

According to the configuration, the resin sealing film and the inorganic sealing film constitute a double-layer structure. This certainly prevents, even in a case where the sealing substrate is made of a thin film material, the organic EL element from being adversely affected by moisture, oxygen, or the like coming through the sealing substrate.

Therefore, it is possible to provide a highly flexible organic EL panel.

Furthermore, since the resin sealing film and the inorganic sealing film are stacked on the surface of the sealing substrate which surface faces the element substrate, it is easy to obtain a flat organic EL panel. This reduces the probability of adverse effects on optical characteristics of the organic EL panel.

Furthermore, it is possible to achieve an organic EL panel having a narrow frame.

In order to attain the object, the organic EL panel of the present invention can be configured such that the resin sealing film, the inorganic sealing film, and an adhesive are stacked in this order on the surface of the sealing substrate which surface faces the element substrate.

With the configuration, even in a case where the sealing substrate is made of a thin film material, the resin sealing film can offset unevenness or pinholes of the thin film material.

In order to attain the object, the organic EL panel of the present invention can be configured such that the inorganic sealing film and the resin sealing film are stacked in this order on the surface of the sealing substrate which surface faces the element substrate.

According to the configuration, the resin sealing film serves also as an adhesive. This makes it unnecessary to separately provide an adhesive.

The organic EL panel in accordance with an embodiment of the present invention is preferably configured such that the resin sealing film is made of polyvinyl alcohol.

According to the configuration, the sealing film made of polyvinyl alcohol is highly hydrophilic and thus absorbs moisture coming from the sealing substrate side. This makes it possible to prevent adverse effects on the organic EL element.

The organic EL panel in accordance with the embodiment of the present invention is preferably configured such that the inorganic sealing film is made of silicon oxide.

According to the configuration, the sealing film made of silicon oxide formed by vapor deposition such as plasma CVD is highly hydrophilic and thus absorbs moisture coming from the sealing substrate side. This makes it possible to prevent adverse effects on the organic EL element.

Furthermore, the sealing film made of silicon oxide also has very high mechanical strength and excellent heat resistance.

The organic EL panel in accordance with the embodiment of the present invention is preferably configured such that the resin sealing film has a thickness of 5 μm or more to 50 μm or less.

The organic EL panel in accordance with the embodiment of the present invention is preferably configured such that the inorganic sealing film has a thickness of 5 μm or more to 50 μm or less.

The organic EL panel in accordance with the embodiment of the present invention is preferably configured such that an inorganic sealing film is provided on a surface of the element substrate which surface faces the sealing substrate.

With the configuration, it is possible to prevent the organic EL element from being adversely affected by moisture, oxygen, or the like coming through the element substrate.

The organic EL panel in accordance with the embodiment of the present invention is preferably configured such that: the organic EL element is provided on the element substrate; and an inorganic sealing film is provided so as to cover the organic EL element.

With the configuration, it is possible to even more certainly prevent the organic El element from being adversely affected by moisture, oxygen, or the like.

The organic EL panel in accordance with the embodiment of the present invention is preferably configured such that the sealing substrate and the element substrate are each made of a flexible material.

With the configuration, it is possible to provide a highly flexible organic EL panel.

In order to attain the object, a method for producing an organic EL panel in accordance with the present invention is a method for producing an organic EL panel including: an element substrate; a sealing substrate; and an organic EL element which is (i) sandwiched between the element substrate and the sealing substrate and (ii) constituted by at least an anode, an organic light emitting layer and a cathode which are stacked together, said method including the step of: forming, on a surface of the sealing substrate which surface faces the element substrate, a resin sealing film made of polyvinyl alcohol and an inorganic sealing film made of silicon oxide so that the resin sealing film and the inorganic sealing film are stacked together.

According to the method, the sealing film made of polyvinyl alcohol is highly hydrophilic and thus absorbs moisture coming from the sealing substrate side. This makes it possible to prevent adverse effects on the organic EL element.

Furthermore, the sealing film made of silicon oxide formed by vapor deposition such as plasma CVD is highly hydrophilic and thus absorbs moisture coming from the sealing substrate side. This makes it possible to even more certainly prevent adverse effects on the organic EL element.

Hence, even in a case where the sealing substrate is made of a thin film material, a double-layer structure constituted by the sealing film made of polyvinyl alcohol and the sealing film made of silicon oxide certainly prevents the organic EL element from adversely affected by moisture or oxygen coming through the sealing substrate.

Moreover, since the organic EL panel is configured such that the sealing film made of polyvinyl alcohol and the sealing film made of silicon oxide are stacked on the surface of the sealing substrate which surface faces the element substrate, it is possible to obtain a flat organic EL panel, and the probability of adverse effects on optical characteristics of the organic EL panel is reduced.

Furthermore, it is possible to achieve an organic EL panel having a narrow frame.

INDUSTRIAL APPLICABILITY

An organic EL panel of the present invention is highly dependable, and is therefore suitably applicable to a display device.

REFERENCE SIGNS LIST

1 Organic EL panel
10 Element substrate
11 Adhesive
12 $SiO_2$ sealing film
13 PVA sealing film
14 Sealing substrate
15 Organic EL element
16, 17 Protection film

The invention claimed is:

1. An organic EL panel comprising:
an element substrate;
a sealing substrate; and
an organic EL element which is (i) sandwiched between the element substrate and the sealing substrate and (ii) constituted by at least an anode, an organic light emitting layer and a cathode which are stacked together,
the sealing substrate having, on its surface facing the element substrate, an inorganic sealing film and a resin sealing film stacked together in this order, and wherein the resin sealing film has a thickness of 5 µm or more to 50 µm or less.

2. The organic EL panel as set forth in claim 1, wherein the resin sealing film is made of polyvinyl alcohol.

3. The organic EL panel as set forth in claim 1, wherein the inorganic sealing film is made of silicon oxide.

4. The organic EL panel as set forth in claim 1, wherein the inorganic sealing film has a thickness of 5 µm or more to 50 µm or less.

5. The organic EL panel as set forth in claim 1, wherein an inorganic protection film is provided on a surface of the element substrate which surface faces the sealing substrate.

6. The organic EL panel as set forth in claim 5, wherein:
the organic EL element is provided on the element substrate; and
another inorganic protection film is provided so as to cover the organic EL element.

7. The organic EL panel as set forth in claim 1, wherein the sealing substrate and the element substrate are each made of a flexible material.

8. A method for producing an organic EL panel,
the organic EL panel including:
an element substrate;
a sealing substrate; and
an organic EL element which is (i) sandwiched between the element substrate and the sealing substrate and (ii) constituted by at least an anode, an organic light emitting layer and a cathode which are stacked together,
said method, comprising the step of:
forming, on a surface of the sealing substrate which surface faces the element substrate, an inorganic sealing film made of silicon oxide and a resin sealing film made of polyvinyl alcohol so that the inorganic sealing film and the resin sealing film are stacked together in this order, wherein the resin sealing film serves as an adhesive.

9. An organic EL panel comprising:
an element substrate;
a sealing substrate; and
an organic EL element which is (i) sandwiched between the element substrate and the sealing substrate and (ii) constituted by at least an anode, an organic light emitting layer and a cathode which are stacked together,
the sealing substrate having, on its surface facing the element substrate, an inorganic sealing film and a resin sealing film stacked together in this order, wherein the sealing substrate and the element substrate are each made of a flexible material, and wherein the resin sealing film serves as an adhesive.

10. The organic EL panel as set forth in claim 9, wherein the resin sealing film is made of polyvinyl alcohol.

11. The organic EL panel as set forth in claim 9, wherein the inorganic sealing film is made of silicon oxide.

12. The organic EL panel as set forth in claim 9, wherein the inorganic sealing film has a thickness of 5 µm or more to 50 µm or less.

13. The organic EL panel as set forth in claim 9, wherein an inorganic protection film is provided on a surface of the element substrate which surface faces the sealing substrate.

14. The organic EL panel as set forth in claim 13, wherein:
the organic EL element is provided on the element substrate; and
another inorganic protection film is provided so as to cover the organic EL element.

15. An organic EL panel comprising:
an element substrate;
a sealing substrate; and
an organic EL element which is (i) sandwiched between the element substrate and the sealing substrate and (ii) constituted by at least an anode, an organic light emitting layer and a cathode which are stacked together,
the sealing substrate having, on its surface facing the element substrate, an inorganic sealing film and a resin sealing film stacked together in this order, wherein the sealing substrate and the element substrate are each made of a flexible material, and wherein the inorganic sealing film has a thickness of 5 µm or more to 50 µm or less.

16. The organic EL panel as set forth in claim 15, wherein the inorganic sealing film is made of silicon oxide.

17. An organic EL panel comprising:
an element substrate;
a sealing substrate; and
an organic EL element which is (i) sandwiched between the element substrate and the sealing substrate and (ii) constituted by at least an anode, an organic light emitting layer and a cathode which are stacked together,
the sealing substrate having, on its surface facing the element substrate, an inorganic sealing film and a resin sealing film stacked together in this order, wherein the sealing substrate and the element substrate are each made of a flexible material, wherein an inorganic protection film is provided on a surface of the element substrate which surface faces the sealing substrate.

18. The organic EL panel as set forth in claim 17, wherein the inorganic sealing film is made of silicon oxide.

19. The organic EL panel as set forth in claim 17, wherein:
the organic EL element is provided on the element substrate; and
another inorganic protection film is provided so as to cover the organic EL element.

* * * * *